United States Patent [19]
Hotta et al.

[11] Patent Number: 4,978,957
[45] Date of Patent: Dec. 18, 1990

[54] HIGH-SPEED ANALOG-TO-DIGITAL CONVERTER

[75] Inventors: Masao Hotta, Hanno; Toshihiko Shimizu; Yoshito Nejime, both of Hachioji, Japan

[73] Assignee: Hitachi, Ltd., Tokyo, Japan

[21] Appl. No.: 475,799

[22] Filed: Feb. 6, 1990

[30] Foreign Application Priority Data

Mar. 10, 1989 [JP] Japan .................................. 01-059430

[51] Int. Cl.$^5$ ............................................. H03M 1/36
[52] U.S. Cl. .................................... 341/156; 341/158; 341/159
[58] Field of Search ............... 341/156, 158, 159, 153, 341/154, 145, 155, 160, 165

[56] References Cited

U.S. PATENT DOCUMENTS

| | | | |
|---|---|---|---|
| 4,633,219 | 12/1986 | Zojer et al. | 341/159 |
| 4,635,036 | 1/1987 | Yoshizawa | 341/159 |
| 4,719,447 | 1/1988 | Garuts | 341/159 |
| 4,763,106 | 8/1988 | Gulczynski | 341/159 |

OTHER PUBLICATIONS

"Monolithic 8-Bit A/D Converter with 120 MHz Conversion Rate", Inoue et al., IEEE Solid-State Circuits, vol. 19, No. 6, 12/84.

Primary Examiner—William M. Shoop, Jr.
Assistant Examiner—Brian K. Young
Attorney, Agent, or Firm—Antonelli, Terry, Stout & Kraus

[57] ABSTRACT

Disclosed is a parallel analog-to-digital converter in which a plurality of comparators are divided into a plurality of groups each consisting of a predetermined number of comparators, and outputs of at least these comparators belonging to the same group are added in an analog or digital fashion. Whether or not the result of addition of the outputs of the comparators exceeds a predetermined threshold level is decided in an analog or digital fashion so as to determine high-order and low-order bits of a digital output signal of the converter on the basis of the result of decision.

19 Claims, 12 Drawing Sheets

FIG. 5(A)

| COMPARATOR GROUP | CORRESPONDING DIGITAL VALUE | COMPARATOR OUTPUT PATTERN | | | | | | | |
|---|---|---|---|---|---|---|---|---|---|
| | | A | B | C | D | E | F | G | H |
| | 100101 | 0 | 0 | 0 | 0 | 0 | 0 | 0 | 0 |
| | 100100 | 0 | 0 | 0 | 0 | 0 | 0 | 0 | 0 |
| | 100011 | 0 | 0 | 0 | 0 | 0 | 0 | 0 | 0 |
| | 100010 | 0 | 0 | 0 | 0 | 1 | 0 | 0 | 0 |
| (J+7) | 100001 | 0 | 0 | 0 | 0 | 0 | 0 | 0 | 1 |
| | 100000 | 0 | 0 | 0 | 1 | 0 | 0 | 0 | 0 |
| | 011111 | 0 | 0 | 0 | 1 | 0 | 0 | 0 | 0 |
| | 011110 | 0 | 0 | 0 | 0 | 0 | 0 | 0 | 0 |
| (J+3) | 011101 | 0 | 0 | 1 | 0 | 0 | 0 | 0 | 0 |
| | 011100 | 0 | 1 | 1 | 0 | 0 | 0 | 0 | 0 |
| | 011011 | 0 | 0 | 0 | 0 | 0 | 0 | 0 | 0 |
| (j) | 011010 | 1 | 1 | 1 | 1 | 1 | 1 | 1 | 1 |
| | 011001 | 1 | 1 | 1 | 1 | 1 | 1 | 1 | 1 |
| | 011000 | 1 | 1 | 1 | 1 | 1 | 1 | 0 | 1 |
| (J-3) | 010111 | 1 | 1 | 1 | 1 | 1 | 1 | 0 | 0 |
| | 010110 | 1 | 1 | 1 | 1 | 1 | 1 | 1 | 1 |
| | 010101 | 1 | 1 | 1 | 1 | 1 | 0 | 1 | 1 |
| | 010100 | 1 | 1 | 1 | 1 | 1 | 1 | 1 | 1 |
| | 010011 | 1 | 1 | 1 | 1 | 1 | 1 | 1 | 1 |

FIG. 5(B)

| COMPARATOR OUTPUT PATTERN | ADC DIGITAL OUTPUT | | | |
|---|---|---|---|---|
| | PRIOR ART | ERROR (LSB) | PRESENT INVENTION | ERROR (LSB) |
| A | 0 1 1 0 1 0 | 0 | 0 1 1 0 1 0 | 0 |
| B | 0 1 1 1 1 0 | 4 | 0 1 1 0 1 1 | 1 |
| C | 0 1 1 1 1 1 | 5 | 0 1 1 0 1 1 | 1 |
| D | 1 1 1 0 1 0 | 32 | 0 1 1 0 1 0 | 0 |
| E | 1 1 1 0 1 0 | 32 | 0 1 1 0 1 0 | 0 |
| F | 0 1 1 1 1 0 | 4 | 0 1 0 1 1 1 | -3 |
| G | 0 1 1 1 1 0 | 4 | 0 1 0 1 1 0 | -4 |
| H | 1 1 1 1 1 1 | 37 | 0 1 0 1 1 0 | -4 |

| COMPARATOR OUTPUT PATTERN | ADC DIGITAL OUTPUT | | | |
|---|---|---|---|---|
| | PRIOR ART | ERROR (LSB) | PRESENT INVENTION | ERROR (LSB) |
| A | 011010 | 0 | 011010 | 0 |
| B | 011110 | 4 | 011011 | 1 |
| C | 011111 | 5 | 011011 | 1 |
| D | 111010 | 32 | 011010 | 0 |
| E | 111010 | 32 | 011010 | 0 |
| F | 011110 | 4 | 011010 | 0 |
| G | 011111 | 5 | 011010 | 0 |
| H | 111111 | 37 | 011010 | 0 |

F I G. 12
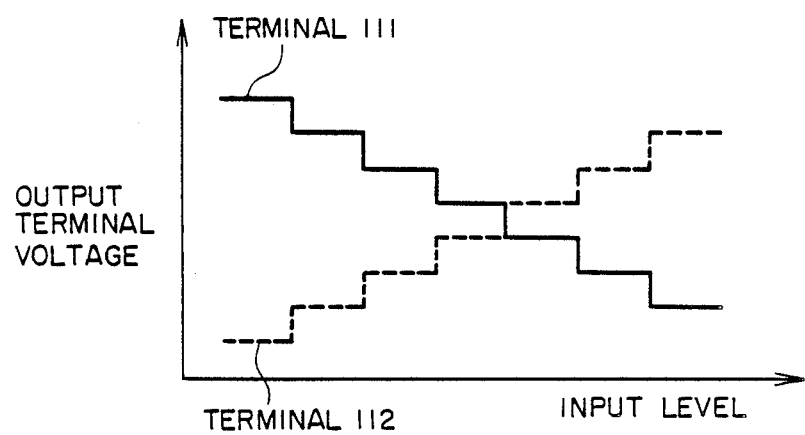

HIGH-SPEED ANALOG-TO-DIGITAL CONVERTER

BACKGROUND OF THE INVENTION

This invention relates to analog-digital converters, and more particularly to an analog-digital converter (which will be abbreviated hereinafter as an "ADC") which is suitable for handling a high-speed signal such as a video signal.

A prior art parallel ADC commonly known as a means suitable for handling a high-speed signal has generally a structure as shown in FIG. 1. Referring to FIG. 1, the prior art parallel ADC comprises $(2^n-1)$ comparators 11A (where n is the number of output bits) and an encoder (a code conversion circuit) 200. (The number of these comparators 11A is $2^n$ when an overflow is taken into account.) A plurality of reference voltages $V_J$ obtained by voltage divider using resistor string and having different levels, for example, $(2^n-1)$ levels corresponding to a desired resolution are compared with an analog input voltage $V_{IN}$ by the $(2^n-1)$ comparators 11A respectively. The encoder 200 converts the output pattern of these comparators 11A into a corresponding binary-coded pattern. Each of the comparators 11A is composed of a comparing part 111A and an exclusive-OR circuit 121A. The comparing part 111A compares the input voltage $V_{IN}$ with the level of the reference voltage $V_J$ applied thereto.

Where the reference voltages $V_J$ are lower than the input voltage $V_{IN}$, all of the corresponding comparing parts 111A generate outputs of high potential level (which will be expressed hereinafter as a "1"). On the other hand, where the reference voltages $V_J$ are higher than the input voltage $V_{IN}$, all of the corresponding comparing parts 111A generate outputs of low potential level (which will be expressed hereinafter as a "0"). In the pair of the comparators 11A receiving the reference voltages $V_J$ of adjacent levels, the exclusive-OR circuits 121A detect coincidence between the outputs of the comparing parts 111A. Therefore, among the exclusive-OR circuits 121A in the comparators 11A, only one exclusive-OR circuit 121A corresponding to the position where the output of the associated comparing part 111A changes from a "0" to a "1", generates a "1" as its output, which each of all the remaining exclusive-OR circuits 121A generates a "0" as its output. That is, this exclusive-OR circuit 121A generating a "1" as its output corresponds to the level of the analog input voltage $V_{IN}$. The outputs of all the comparators 11A are connected to individual corresponding bit wires of wired OR connections in the encoder 200.

In the parallel ADC having the structure described above, latching comparators are commonly employed to provide the comparing parts 111A of the comparators 11A. However, when a fast changing input signal is applied to the prior art parallel ADC, two or more of the exclusive-OR circuits 121A may generate a "1" as their outputs although normally only one exclusive-OR circuit 121A should generate a "1" as its output. Such a phenomenon is attributable to delayed arrival of the input signal at the individual comparators 11A and attributable also to delayed application of a clock signal to the individual latching comparators 111A.

In such a case, the digital output of the encoder (the code conversion circuit) 200 will be entirely different from the true digital equivalent of the analog input voltage $V_{IN}$ due to the wired-OR connections of the bit wires in the code conversion circuit 200, and false code error or missing code will result. In this case, serious false code error tends to occur especially at a change point between a high-order bit and a low-order bit. Suppose, for example, that one of the comparators 11A generates a "1" as its output to provide a digital output "011---11" in binary notation. However, when the next adjacent comparator 11A generates also a "1" as its output at the same time, the digital output of the code conversion circuit 200 is now given by "111---11" which is the logical sum (OR) of "011----11" and "100----00", and a serious error which is as large as ½ of the full scale will occur.

A method for avoiding occurrence of such an error in a prior art parallel ADC was proposed in a report entitled "A Monolithic 8-Bit A/D Converter with 120 MHz Conversion Rate Vol. SC-19 No. 6, December 1984". According to the method described in the report, a comparator group is divided into blocks at a change point between a high-order bit and a low-order bit, and the output of a code conversion circuit in a high-order block is used to gate the output of a code conversion circuit in a low-order block.

FIG. 2 shows the structure of part of such a parallel ADC based on the proposed method. Referring to FIG. 2, a plurality of voltage-dividing resistors R for providing a plurality of reference voltages having $(2^n-1)$ different levels are connected in series in each of blocks A, B and C, so that these blocks generate high-order bits and low-order bits as their outputs respectively. Suppose now that binary-coded outputs, for example, "0110" and "1001" are generated from the blocks A and B respectively. In such a case, the logical sum (OR) of "0110" and "1001" provides "1111", resulting in a very large error. In order to obviate such a defect, an inhibit circuit is provided in each of these blocks A and B in the ADC structure shown in FIG. 2, so that appearance of the encoder output from the low-order block A can be inhibited by the output (an inhibit signal $S_{INH}$) of the inhibit circuit in the high-order block B. That is, the ADC shown in FIG. 2 is constructed so that the encoder outputs may not be simultaneously generated from the adjacent blocks A and B.

However, because the inhibit signal $S_{INH}$ produced on the basis of the outputs of some of the comparators in the high-order block is used to gate the encoder output of the low-order block in the prior art ADC shown in FIG. 2, a gate circuit must be provided for the bit wires in the encoder circuit in each of the blocks, and the size of each block gated by the inhibit signal $S_{INH}$ is determined by the number of the comparators connected to one encoder. That is, the size of each block is determined depending on the chip layout. Further, according to the method for gating the output of the low-order block by the inhibit signal $S_{INH}$ applied from the high-order block, undesirable false code error due to duplicate appearance of data in the same block cannot be prevented. Therefore, in order to prevent this false code error, the size of the block gated by the inhibit signal $S_{INH}$ is preferably suitably selected according to, for example, the number of bits handled by the ADC. However, this point has not been taken into account in the prior art ADC, and there has been such a problem that, when the blocks have a large size, a large error tends to occur due to duplicate appearance of data in the same block.

SUMMARY OF THE INVENTION

With a view to solve the prior art problem described above, it is an object of the present invention to provide an ADC which minimizes an undesirable error due to duplicate appearance of data attributable of fluctuation of switching speed and response of comparators, thereby minimizing the tendency of occurrence of false code error.

The present invention which attains the above object provides an ADC comprising a plurality of comparators comparing an input signal with a plurality of reference signals having different levels corresponding to a desired resolution to decide the level of the input signal relative to the levels of the reference signals thereby generating a digital signal converted into a thermometer code, and a code conversion circuit performing code conversion of the digital signal so as to generate a desired digital output signal of the converter, wherein the comparators are divided into groups each consisting of a predetermined number of comparators, and, when the outputs of the comparators in each group are added, and the result of addition of the comparator outputs exceeds a predetermined threshold level, the group output of the group is encoded to determine high-order bits of the digital output signal of the ADC, while low-order bits of the digital output signal of the ADC are determined on the basis of the result of addition of the comparator outputs in each group.

In the ADC according to the present invention, the number of "1's" generated from the comparators in each group is based to determine the digital data instead of detecting the change point of the comparator outputs by an exclusive-OR circuit. Therefore, there is fundamentally no possibility of duplicate appearance of data, so that undesirable false code error can be reliably prevented.

BRIEF DESCRIPTION OF THE DRAWINGS

FIGS. 5(A) and 5(B) are charts showing the operation mode and digital output errors respectively in the embodiments shown in FIGS. 3 and 4.

FIG. 12 is a graph for illustrating the operation of the level discriminators in the circuit shown in FIG. 11.

DESCRIPTION OF THE PREFERRED EMBODIMENTS

Preferred embodiments of the present invention will now be described in detail with reference to FIGS. 3 to 12.

Figure 1:
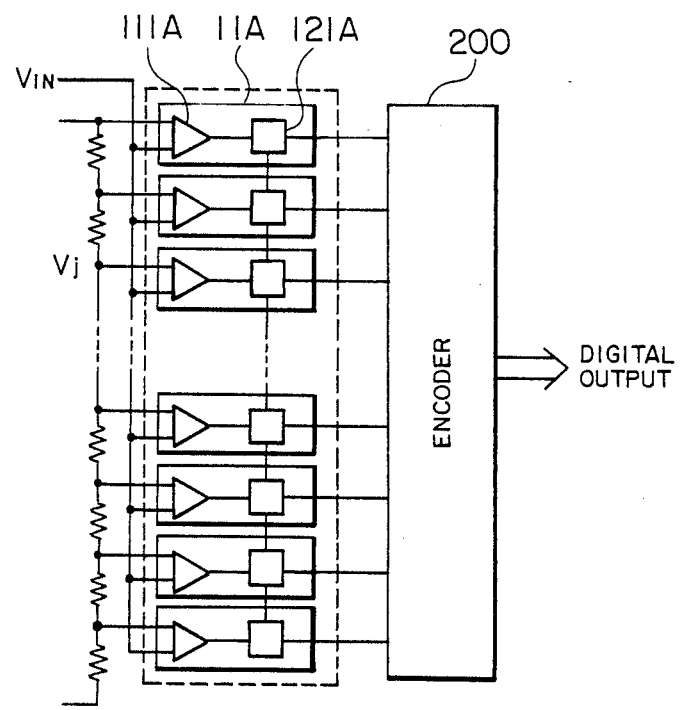
FIG. 1 is a block circuit diagram schematically showing the basic structure of a prior art parallel ADC.
Figure 2:
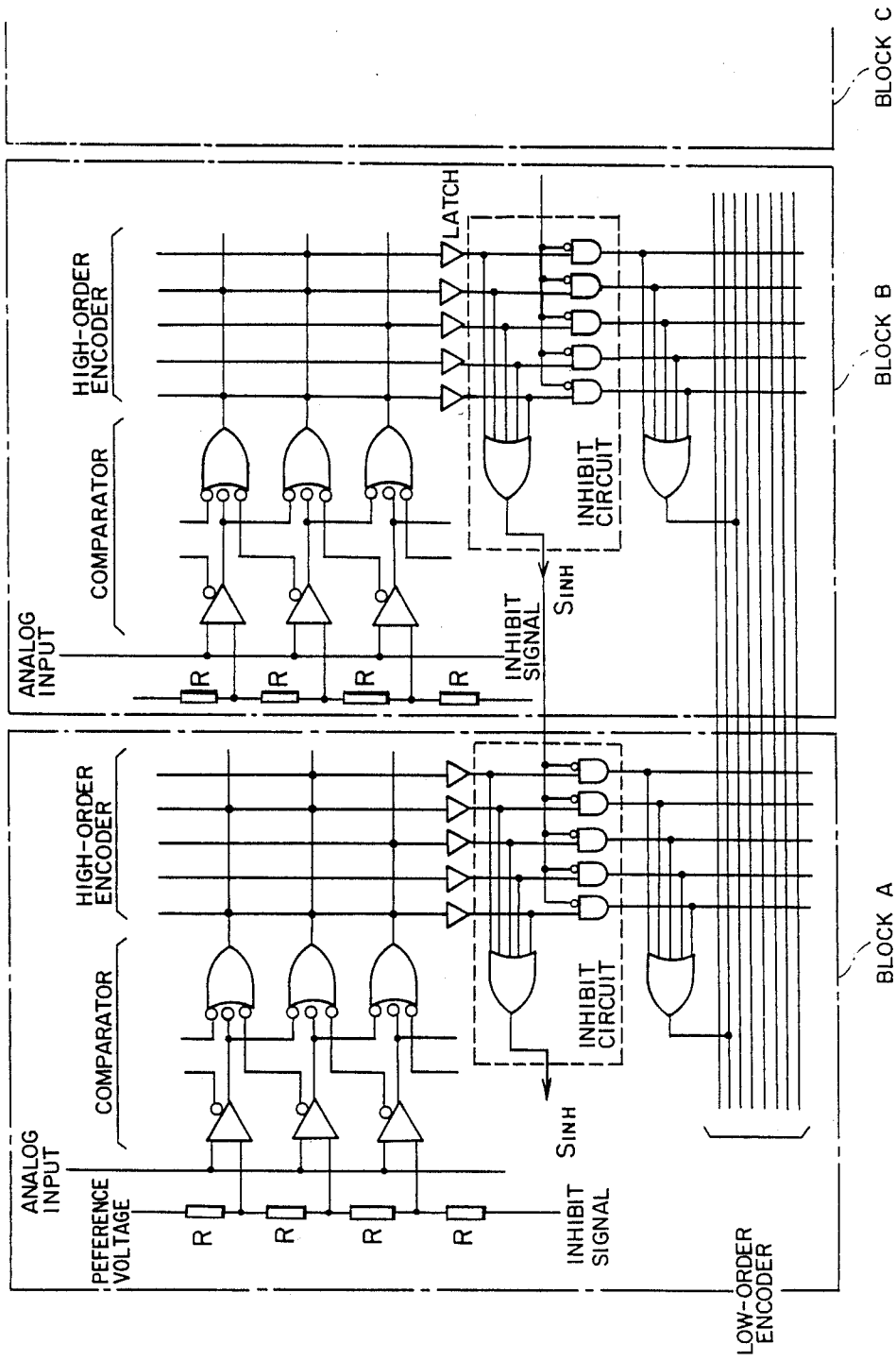
FIG. 2 is a circuit diagram showing part of another form of a prior art parallel ADC.
Figure 3:
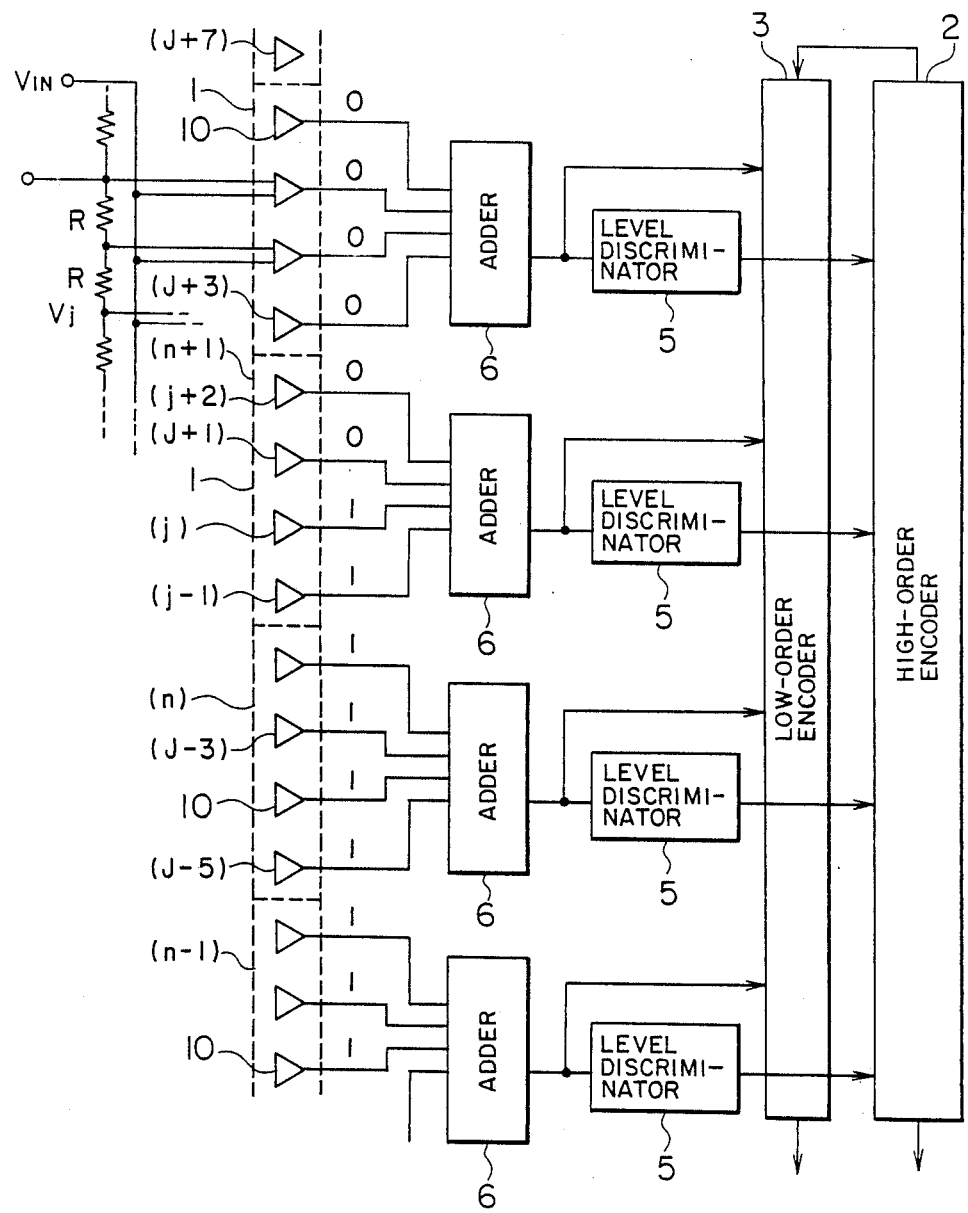
FIGS. 3 and 4 are block circuit diagrams schematically showing the structure of a first and a second embodiment respectively of the parallel ADC according to the present invention.

FIG. 3 is a block circuit diagram showing the structure of a first embodiment of the parallel ADC according to the present invention. Referring to FIG. 3, the parallel ADC embodying the present invention comprises a plurality of comparators 10 divided into a plurality of groups 1, analog or digital adder circuits 6 adding the outputs of the comparators 10 belonging to the plural groups 1 respectively, analog or digital level discriminators 5 each deciding whether or not the result of addition of the comparator outputs by the associated adder circuit 6 exceeds a predetermined level, a high-order encoder 2 determining high-order bits of an ADC output signal, and a low-order encoder 3 determining low-order bits of the ADC output signal. An input signal $V_{IN}$ and one of a plurality of reference voltage signals $V_J$ corresponding to quantization levels are applied to each of the individual comparators 10. It is supposed herein, for conveniences of description, that four comparators 10 constitute each comparator group 1.

It is also supposed herein that each of the comparators 10 where the level of the input signal $V_{IN}$ is higher than that of the reference voltage signal $V_J$ generates a "1" as its output, while each of the comparators 10 where the level of the input signal $V_{IN}$ is lower than that of the reference voltage signal $V_J$ generates a "0" as its output. When now the output of each of (J)th, (J-1)th, (J-2)th, (J-3)th and succeeding comparators 10 in FIG. 3 is a "1", while the output of each of (J+1)th, (J+2)th, (J+3)th and succeeding comparators 10 is a "0" (where J designates the serial number of the comparator 10 corresponding to a change point between a "0" and a "1"), the outputs of all of these comparators 10 are expressed as "---11110000---" which is called herein a thermometer code. The symbol J is expressed as J=4n+i, where n designates the serial number of the comparator group where the output of each of the four comparators 10 in the group is a "1", and i is given by i=0 to 3. Thus, the result of addition of the outputs of the four comparators 10 in each of the (n)th, (n−1)th, (n−2)th and succeeding comparator groups is 4, while the result of addition of the outputs of the four comparators 10 in the (n+1)th comparator group is i which is 0, 1, 2 or 3. The level discriminator 5 associated with each of the adder circuits 6 decides whether or not the result of addition in the adder circuit 6 is 4 or more.

The results of decision in the level discriminators 5 are supplied as an input to the high-order encoder 2, so that the encoder 2 decides that the level of the input voltage $V_{IN}$ corresponds to the output level of the (J)th comparator 10 in the (n+1)th comparator group. Thus, high-order bits of the ADC output signal can be determined. On the basis of the result of above determination, the low-order encoder 3 is controlled so that the results of addition of the comparator outputs in the (n+1)th and succeeding low-order comparator groups only are binary-coded. Thus, low-order bits of the ADC output signal can determined.

Figure 4:
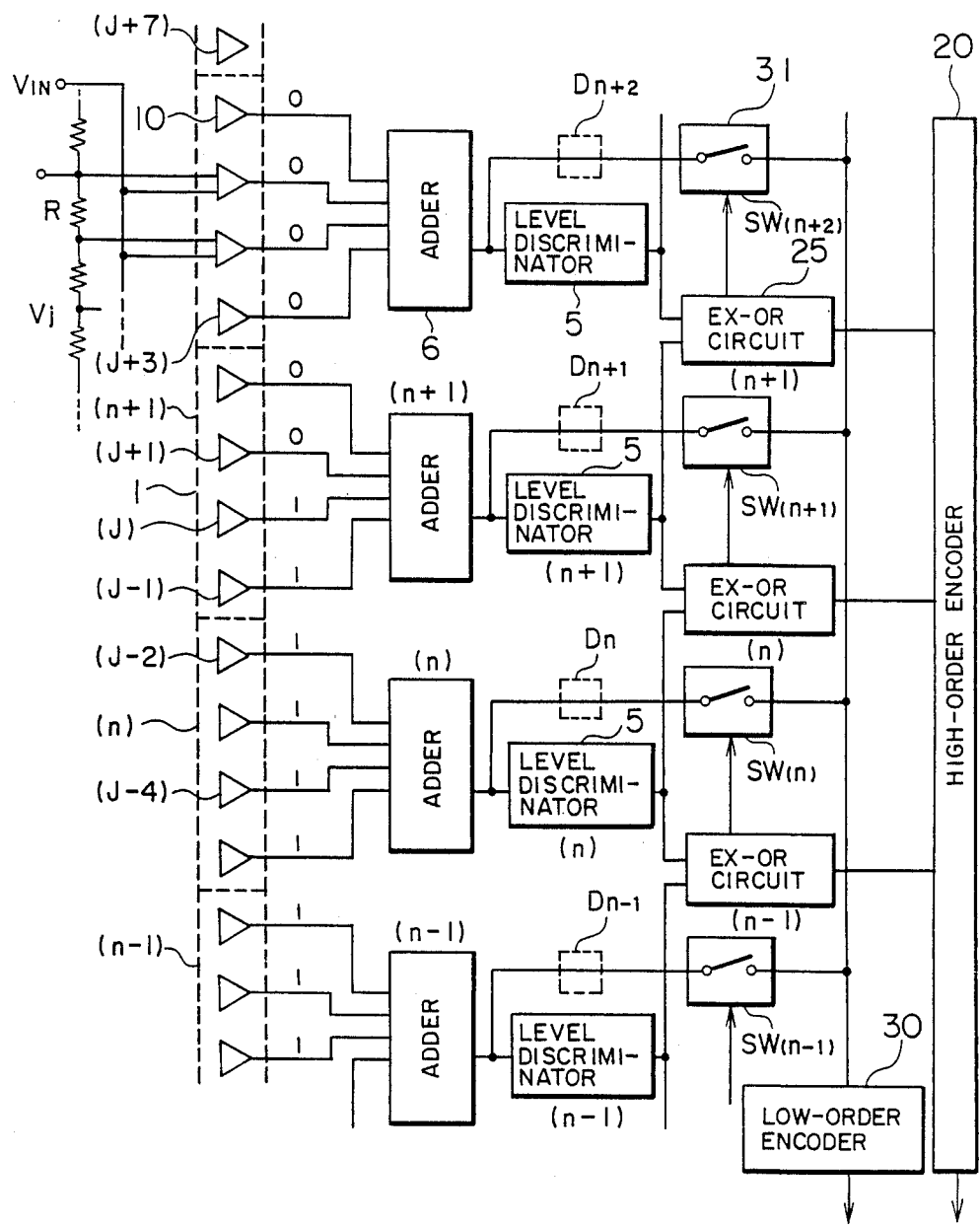

FIG. 4 shows a second embodiment of the parallel ADC according to the present invention. In FIG. 4, the same reference numerals 10, 6 and 5 are used to designate comparators, adder circuits and level discriminators respectively incorporated on the first embodiment. As in the case of the first embodiment, the level discriminator 5 associated with each adder circuit 6 decides whether or not the sum of the comparator outputs in the associated comparator group is 4 or more, and, when the sum is, for example, 4 or more, the level discriminator 5 generates a "1" as its output, while when the sum is 3 or less, the level discriminator 5 generates a "0" as its output.

Suppose now that, as in the case of FIG. 3, the result of addition of outputs from the comparators 10 in each of the (n)th, (n−1)th and succeeding comparator groups is 4 or more, while the result of addition of outputs from the comparators 10 in the (n+1)th comparator group is i which is 3 or less. In such a case, the outputs of the every two adjacent level discriminators 5 are applied to an associated exclusive-OR circuit 25 so as to identify the comparator groups in which each of the four comparators 10 generates a "1" as its output. Thus, in this case, an (n)th exclusive-OR circuit 25 only generates a "1" as its output, and the output of this exclusive-OR circuit 25 is applied to a high-order encoder 20 consisting of OR circuits, so as to determine high-order bits except two low-order bits of the ADC output signal. Switch circuits 31, which are normally in their off state, are controlled by the outputs of the associated exclusive-OR circuits 25 respectively.

Because the (n)th exclusive-OR circuit 25 only generates a "1" as its output as described above, the (n+1)th switch circuit SW(n+1) only is turned on, and the output of the (n+1)th adder circuit 6 is connected to a low-order encoder circuit 30 so as to determine low-order bits of the ADC output signal. It is apparent that this encoder circuit 30 is unnecessary when the result of addition in each of the adder circuits 6 is already binary-coded. Also, when the results of addition in the adder circuits 6 are generated in the form of analog signals, digital conversion circuits $D_{n-1}$ to $D_{n+2}$ as shown in FIG. 4 may be connected between the adder circuits 6 and the switch circuits SW respectively.

The result of AD conversion based on the aforementioned first and second embodiments will now be more concretely described with reference to FIGS. 6(A) and 5(B). FIG. 5(A) show various patterns A to H of the comparator outputs. Herein, comparator output patterns in a 6-bit ADC are taken as an example for simplicity of explanation. Corresponding digital values shown in FIG. 5(A) represent the binary-coded output of the ADC when each of some of the comparators 10, for example, the (J)th, (J−1)th and succeeding comparators 10 generates a "1" as its output. It is supposed herein that the ADC generates its data output "011010" when all the comparators 10 normally operate.

The comparator output pattern A represents the case where the individual comparators operate entirely normally, and it will be seen that the (J)th comparator 10 corresponding to "011010" as will as each of the succeeding (J−1)th, (J−2)th, --- comparators generates a "1" as its output, while each of the (J+1)th, (J+2)th, --- comparators generates a "0" as its output. On the other hand, the comparator output pattern B represents the case where the (J+2)th comparator in the comparator group to which the (J)th comparator belongs generates a "1" as its output dut to incorrect-operation although this (J+2)th comparator should normally generate a "0" as its output. The comparator output pattern C represents the case where each of the (J+2)th comparator in the same comparator group and the (J+3)th comparator in the next adjacent comparator group generates a "1" as its output due to incorrect-operation although they should normally generate a "0" as their outputs. The comparator output pattern D represents the case where each of the (J+5)th and (J+6)th comparators in the next adjacent comparator group generates a "1" as its output due to incorrect-operation although they should normally generate a "0" as their outputs. The comparator output pattern E represents the case where the (J+8)th comparator in the second adjacent comparator group generates a "1" as its output due to incorrect-operation although it should normally generate a "0" as its output. The comparator output pattern F represents the case where the (J−5)th comparator generates a "0" as its output although it should normally generate a "1" as its output. The comparator output pattern G represents the case where each of the (J−2)th and (J−3)th comparators generates a "0" as its output due to incorrect-operation although they should normally generate a "1" as their outputs. Similarly the comparator output pattern H represents the case where the (J+7)th comparator which should normally generate a "0" as its output generates a "1" as its output due to incorrect-operation, while the (J−3)th comparator which should normally generate a "1" as its output generates a "0" as its output due to incorrect-operation.

The prior art method of encoding in which ADC digital outputs corresponding to such comparator output patterns A to H are obtained without taking the false code error into consideration was compared with the method of obtaining those ADC digital outputs according to the aforementioned first and second embodiments of the present invention described above. FIG. 5(B) shows the results of the above comparison. It will be seen from the table shown in FIG. 5(B) that the error in the case of the encoding method according to the present invention is 3 to 4 LSB's at the most, whereas the error in the case of the prior art encoding method is so large that it sometimes exceeds 30 LSB's.

It will be seen from the table shown in FIG. 5(A) that, even when a comparator, which corresponds to a level higher than that of an analog input voltage and which should normally generate a "0" as its output, may not normally operate, the ADC according to the present invention operates very effectively by neglecting incorrect-operation of such a comparator, so that the error that may occur in the digital output of the ADC can be minimized. The ADC according to each of the first and second embodiments is relatively simple in its circuitry and is suitable for application to video equipment such as digital TV which handles a high-speed signal such as a video signal so as to determine the quality of the video signal on the basis of the S/N ratio.

However, in the case of an apparatus such as a waveform digitizer which digitizes a signal waveform into individual digital values, an ADC which will be described now is more suitable than the ADC according to each of the first and second embodiments described already. More precisely, an ADC which will be described now differs from the ADC according to each of the aforementioned embodiments in which, when a comparator corresponding to a level lower than that of an analog input voltage, that is, a comparator which should normally generate a "1" as its output may not normally operate, the position of such a comparator may be decided as a change point for determining high-order bits of the ADC digital output. That is, in the ADC which will be described now, the output of the incorrect-operating comparator is neglected so as to prevent occurrence of an error in the digital output of the ADC.

Figure 6:
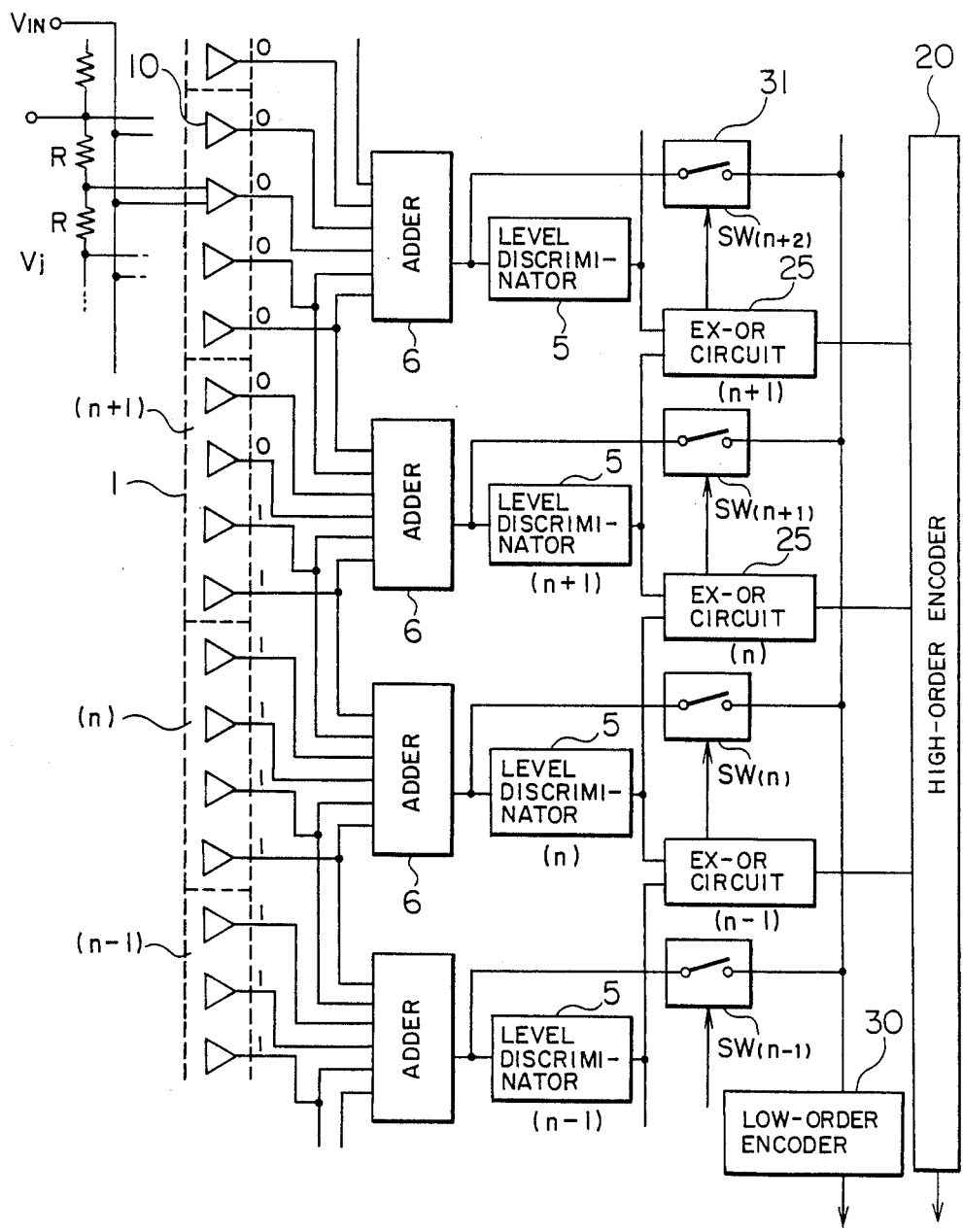
FIG. 6 is a block circuit diagram schematically showing the structure of a third embodiment of the present invention.

FIG. 6 shows a third embodiment of the present invention based on the above principle. In FIG. 6, like reference numerals are used to designate like elements appearing in FIG. 4. In this third embodiment shown in FIG. 6, outputs of comparators 10 in one comparator group and outputs of some of comparators 10 in the next adjacent high-order comparator group are applied to an associated adder circuit 6. FIG. 6 shows that the outputs of four comparators 10 in the same comparator group and the outputs of two comparators 10 in the next adjacent high-order comparator group are applied to the associated adder circuit 6. The operation of this third embodiment will now be described with reference to FIG. 6.

It is supposed herein that each of all the comparators 10 in the (n)th, (n−1)th, --- comparator groups generates a "1" as its output, and the number of the comparators 10 generating a "1" in the (n+1)th comparator group is i which is less than 3. In this case, the result of addition in each of the adder circuits 6 associated with the (n)th, (n−1)th, ---comparator groups is 6, while the result of addition in the adder circuit associated with the (n+1)th comparator group is i. The result of addition in each of the adder circuits 6 is supplied to an associated level discriminator 5 which decides whether or not the sum of the comparator outputs is 4 or more. Then, as in the case of the second embodiment, the outputs of the adjacent level discriminators 5 are applied to an associated exclusive circuit 25. Thus, a change point, that is, a boundary between the (n)th comparator group where all the comparators generate a "1" as their outputs and the (n+1)th comparator group where some of the comparators do not generate a "1" as their outputs, can be detected.

The output of the (n+1)-th exclusive-OR circuit 25 is applied to a high-order encoder 20 so as to determine high-order bits of the digital output of the ADC. At the same time, the output of the (n)th exclusive-OR circuit 25 acts to turn on an (n+1)th switch circuit SW(n+1) 31, and the output of the (n+1)th adder circuit 6 is connected through the (n+1)th switch circuit SW(n+1) to a low-order encoder circuit 30 so as to determine low-order bits according to the result of addition.

The ADC structure shown in FIG. 6 is advantageous in that, even when a comparator or comparators which should normally generate a "1" may generate a "0" due to incorrect-operation as shown by the comparator output patterns F, G and H in FIG. 5(A), the result of addition in each of the associated adder circuits 6 becomes 5 or 4, and the associated level discriminators 5 do not erroneously decide the change point between the comparator groups. Therefore, occurrence of an undesirable conversion error in the ADC can be minimized.

Figures 7, 8:
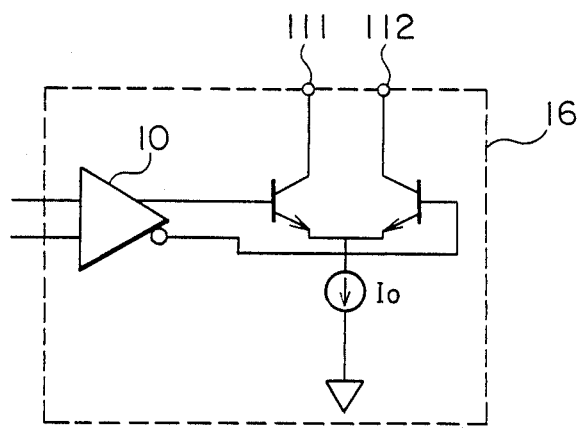
FIG. 7 is a chart similar to that shown in FIG. 5(B), to show digital output errors in the third embodiment shown in FIG. 6.
FIG. 8 is a circuit diagram showing the detailed structure of the adder circuit preferably employed in the aforementioned embodiments of the present invention.

The result of AD conversion by the ADC shown in FIG. 6 was checked on, for example, the comparator output patterns shown in FIG. 5(A). This result of checking is shown in FIG. 7. It will be apparent from the table shown in FIG. 7 that incorrect-operation of a comparator which generates a "0" although it should normally generate a "1" is neglected, so that an undesirable AD conversion error does not substantially occur.

Thus, a very accurate AD-converted value can be obtained.

The detailed structure of the adder circuit 6 will now be described. A conventional digital adder circuit can be used as the adder circuit 6 because the output of the comparator 10 is already in the form of a digital value. However, due to the fact that the digital adder circuit 6 is formed of logic gates arranged in a plurality of stages, the delay time, the number of elements, etc. pose a practical problem. FIG. 8 shows an analog adder circuit which overcomes such a problem and has a relatively simple structure.

Referring to FIG. 8, the analog adder circuit generally designated by the reference numeral 16 includes the combination of a comparator 10 and a current-addition purpose current switch having current output terminals 111 and 112. The comparator 10 may be a pre-amplifier or a latch circuit. For example, when the comparator 10 generates a "1" as its output, current flows out from the current output terminal 111 but does not flow out from the current output terminal 112. In the case of the second embodiment shown in FIG. 4, these current output terminals 111 and 112 are interconnected in the same comparator group so as to derive the current sum. Thus, when load resistors are connected to these current output terminals 111 and 112 respectively, the voltage sum can be obtained.

Figure 9:
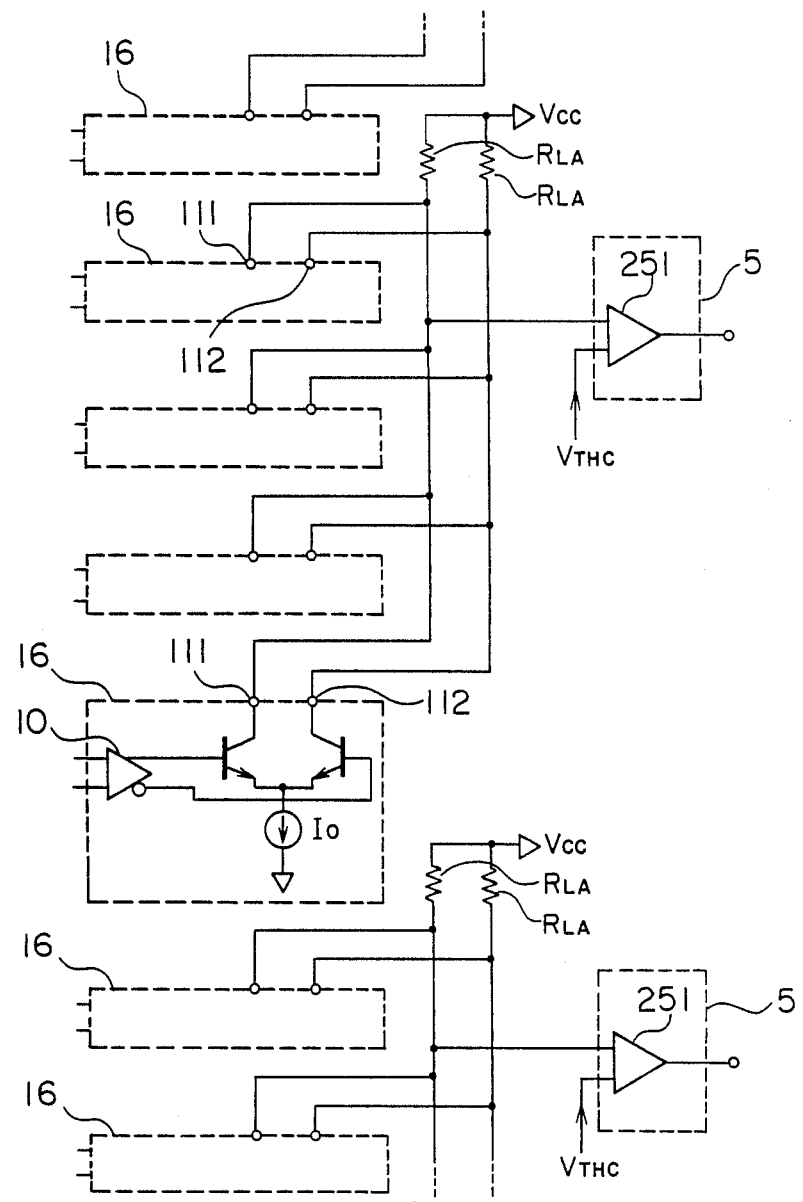
FIG. 9 is a circuit diagram showing the detailed structure of the adder circuits and the level discriminators in the second embodiment shown in FIG. 4.

The voltage thus obtained is compared with a predetermined threshold level $V_{THC}$ in a level discriminator 5 shown in FIG. 9. This discriminator corresponds to that used in the second embodiment shown in FIG. 4. Suppose now that the comparator 10 generates a current output $I_o$, resistances of the load resistors are $R_{LA}$, and the power supply voltage is $V_{cc}$ in FIG. 9. Then, whether or not the result of addition of the outputs of the four comparators 10 is 4 or more can be decided when the threshold level $T_{THC}$ is so selected as to satisfy the following relation:

$$V_{cc} - 3I_o \cdot R_{LA} > V_{THC} > V_{cc} - 4I_o \cdot R_{LA}$$

In FIG. 9, the reference numeral 251 designates a comparator constituting part of the level discriminator 5.

Thus, in FIG. 9, the output of the comparator 251 corresponds the output of the level discriminator 5 shown in FIG. 4. Further, by the function of the switch circuits each of which is controlled by the combination of the level discriminator and the exclusive-OR circuit, the comparator group corresponding to the result of addition which changes from 4 to 3 or less is selected, and this result of addition is binary coded to determine low-order bits.

In this case, the voltage drops across the load resistors $R_{LA}$, that is, the result of addition obtained in the form of an analog quantity may be applied through an analog switch to a 2-bit AD conversion circuit so as to determine low-order bits. Alternatively, the result of addition of comparator outputs in each comparator group may be first converted into a digital value by a 2-bit AD conversion circuit, and, by the function of the switch circuits or gate circuits each of which is controlled by the combination of the level discriminator and the exclusive-OR circuit, only the result of addition in the comparator group in which the result of addition changes from 4 to 3 or less is selected so as to determine low-order bits.

Figure 10:
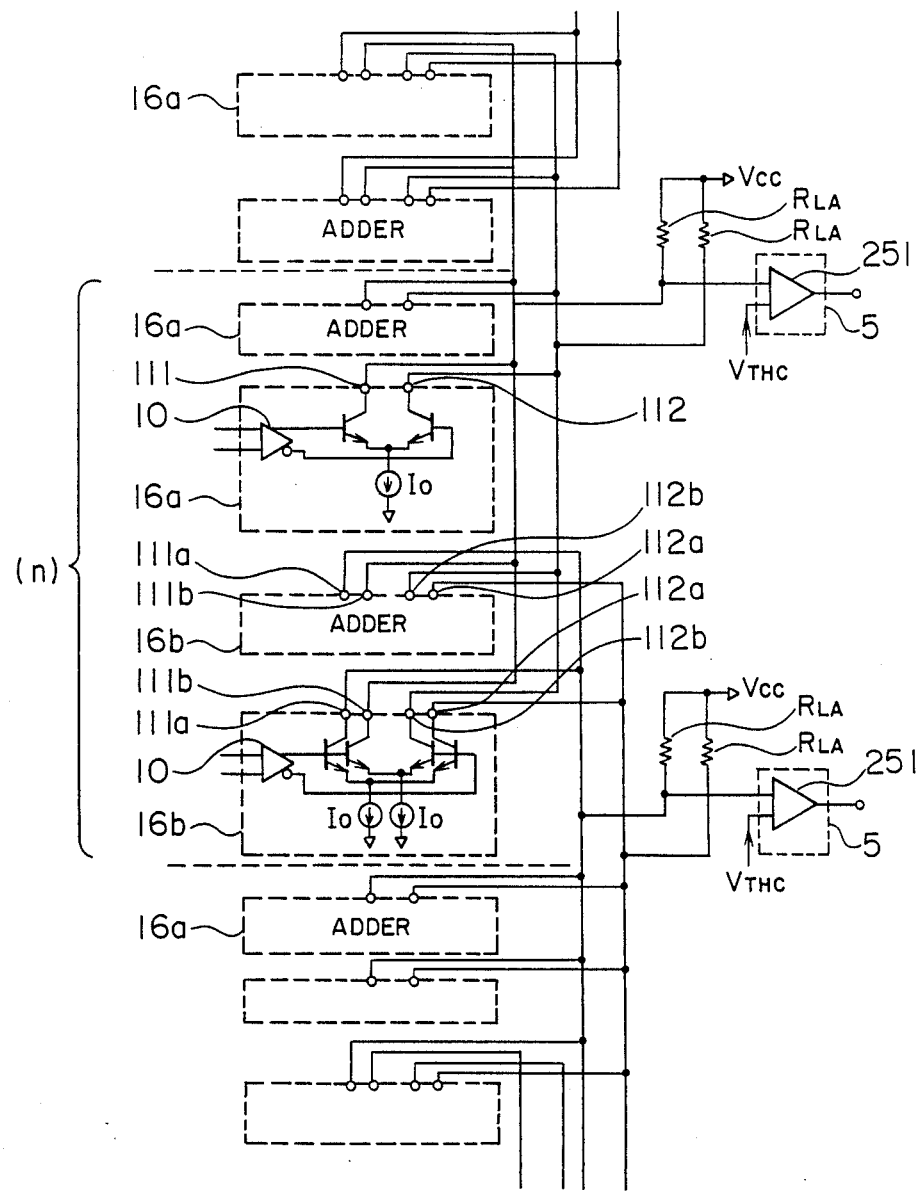
FIGS. 10 and 11 are circuit diagrams showing the detailed structure of two forms respectively of the adder circuits and the level discriminators in the third embodiment shown in FIG. 6.

FIG. 10 shows the structure of adder circuits and level discriminators corresponding to those employed in the third embodiment shown in FIG. 6. In FIG. 10, four comparators constitute each of a plurality of comparator groups, and outputs of all the comparators belonging to one comparator group and those of two comparators belonging to the next adjacent high-order comparator group, that is, a total of six comparator outputs are added in each adder circuit. This addition can be realized by an arrangement in which each of two comparators in each comparator group has two current output terminals. In FIG. 10, the reference numeral 16a designates the adder circuit composed of the comparator 10 and one current switch having one set of current output terminals 111 and 112, while the reference numeral 16b designates the adder circuit composed of the comparator 10 and two current switches having two set of current output terminals 111a, 112a, 11b, and 112b.

It is apparent that, as in the case of FIG. 9, each level discriminator 5 can be provided by a comparator 251 whose threshold level $V_{THC}$ is selected to satisfy the following relation:

$$V_{cc} - 3I_o \cdot R_{LA} > V_{THC} > V_{cc} - 4I_o \cdot R_{LA}$$

When the output currents of all of the six comparators 10 are supplied to the load resistors $R_{LA}$, the voltage drop across the load resistors $R_{LA}$ becomes maximum. In order that the transistor(s) constituting each current switch may not be saturated at that time, the voltage drop $I_o \cdot R_{LA}$ across each load resistor $R_{LA}$ due to the supply of the output current $I_o$ of each comparator 10 should not be extremely large and should be selected to be about 0.2 V at the maximum. Therefore, it may be difficult to determine the threshold level $T_{THC}$ which satisfies the relation described above regardless of variations in the values of $I_o$ and $R_{LA}$.

Figure 11:
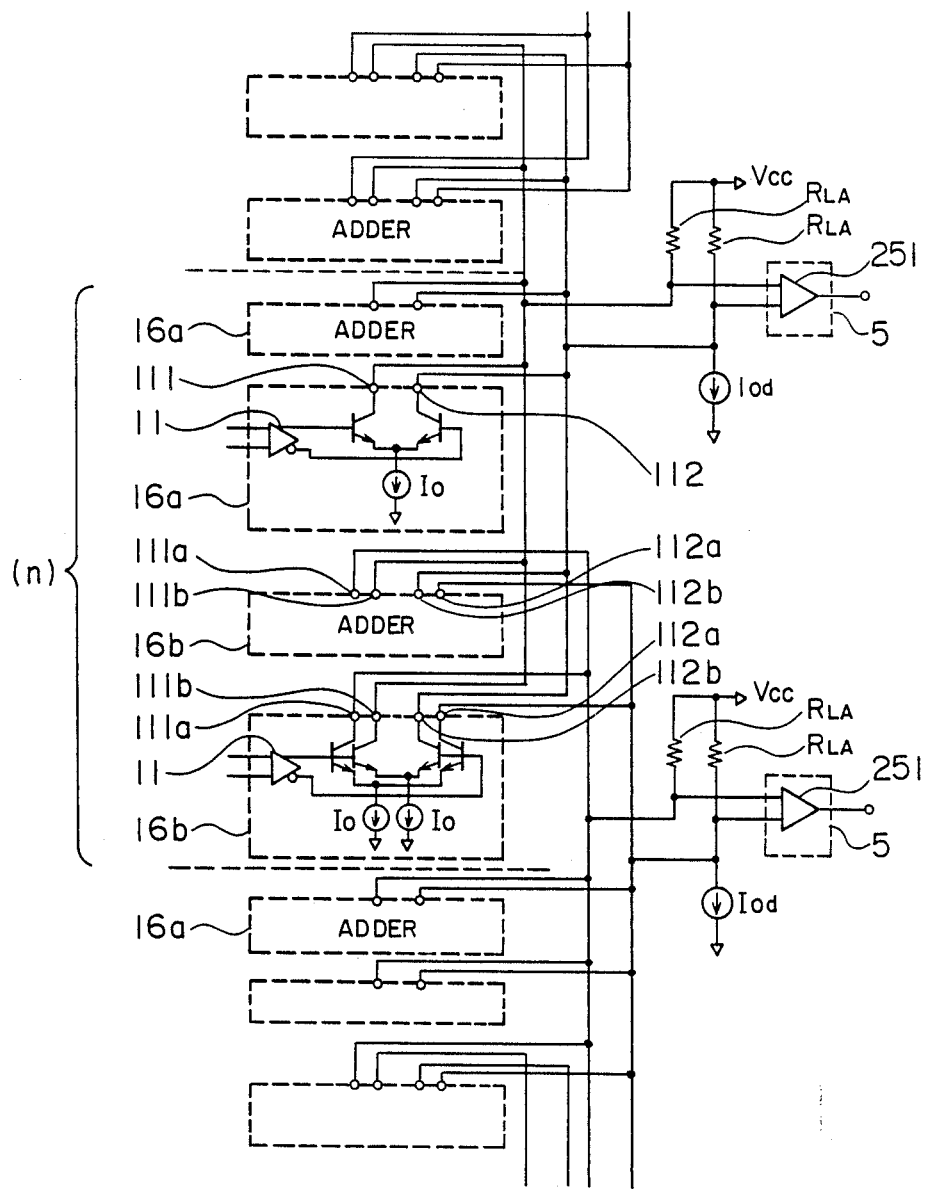

Such as problem can be solved by an arrangement as shown in FIG. 11. FIG. 11 shows an improvement in the arrangement of the adder circuits and the level discriminators shown in FIG. 10. Referring to FIG. 11, the current output terminals 111 on each of which a current output appears when the corresponding comparator 10 generates a "1" are connected to the same load resistor $R_{LA}$, while their invented current output terminals 112 are also connected to the same load resistor $R_{LA}$, and a current equal to the output current $I_o$ of each comparator 10 is supplied from a separate constant current source $I_{od}$ to the invented current output terminals 112. In this arrangement, the voltages appearing at the current output terminals 111 and the inverted current output terminals 112 changes in a relation as shown in FIG. 12 as the outputs of the individual comparators 10 change sequentially from a "0" to a "1", and changeover between the voltages appearing at the output terminals 111 and 112 occurs at a point where the number of the comparators 10 generating a "1" changes from 3 to 4.

Therefore, when the voltages appearing at the current output terminals 111 and 112 are compared by the comparator 251, whether or not the result of addition of the comparator outputs is 4 or more can be decided. Thus, according to the arrangement shown in FIG. 11, any variations in the values of the output current $I_o$ and the load resistors $R_{LA}$ do not pose any practical problem, so that the comparator group output level can be stably decided.

In the case of the arrangements shown in FIGS. 10 and 11 too, low-order bits of the digital output signal of the ADC can be determined in a manner similar to that described with reference to FIG. 9. That is, the amount of voltage drop representing the result of addition of the comparator outputs may be selected by an analog switch, and the output of the analog switch may be applied to a 2-bit AD conversion circuit so as to determine low-order bits. Alternatively, the result of addition of the comparator outputs in each comparator group may be converted into a digital value by a 2-bit AD conversion circuit, and the digital output of the AD conversion circuit may be selected by a switch or a gate circuit so as to determine low-order bits.

In the above description, a 2-bit AD conversion circuit is referred to as a means for determining low-order bits. This is because the number of comparators constituting each comparator group is 4, and the maximum value of the selected result of addition is 3. Although the number of comparators constituting each comparator group is set at 4 for conveniences of description, it is apparent that the number of comparators constituting each comparator group can be freely selected. In this connection, the number of comparators constituting each comparator group is preferably selected to be $2^M$ (M=2, 3,---) so as to facilitate conversion into a binary-coded output.

As described in detail in the foregoing first, second and third embodiments of the present invention, the outputs of level discriminators connected through associated adder circuits to adjacent high-order comparator groups are applied to associated exclusive-OR circuits so as to determine high-order bits on the basis of the result of the exclusive-OR logic. In this case, it is generally convenient for the purpose of processing to convert the outputs of the comparator groups into a binary-coded equivalent. However, it is apparent that any other suitable code, for example, the Gray code may be employed.

It will be understood from the foregoing detailed description that the present invention provides an ADC including a plurality of comparators comparing an input signal with a plurality of reference signals having different levels corresponding to a desired resolution to decide the level of the input signal relative to the levels of the reference signals thereby generating a digital signal converted into a thermometer code, and a code conversion circuit performing code conversion of the digital signal so as to generate a desired digital output signal of the converter, wherein the comparators are divided into a plurality of groups each consisting of a predetermined number of comparators, and, when the outputs of the comparators in each group are added, and the results of addition of the comparator outputs in one of the groups exceeds a predetermined threshold level, the group output of that group is code-converted to determine high-order bits of the digital output signal of the ADC, while low-order bits of the digital output signal of the ADC are determined on the basis of the result of addition of the comparator outputs in each group. Therefore, the tendency of duplicated appearance of data attributable to incorrect operation of the comparators can be prevented, and a conversion error for a high-speed input signal can be minimized. The present invention is further advantageous in that any especial process is not required for integration of the ADC into an integrated circuit, and the scale of the circuitry is not increased over that of prior art ones, so that the cost performance can be greatly improved.

We claim:

1. An analog-to-digital converter comprising:

means including a plurality of series-connected resistors for providing a plurality of reference signals corresponding to a desired resolution;

a plurality of parallel-connected comparators for comparing an analog input signal with said reference signals;

adder means for adding outputs of said comparators belonging to each of groups obtained by dividing said plural comparators into groups each consisting of a predetermined number of said comparators;

level discrimination means for deciding whether or not the output level of each of said adder means exceeds a predetermined threshold level;

high-order code conversion means for determining high-order bits on the basis of the values of the outputs of said level discrimination means; and low-order code conversion means for determining low-order bits on the basis of the values of the outputs of said level discrimination means.

2. An analog-to-digital converter according to claim 1, further comprising change point detection means for detecting a change point between the outputs of adjacent ones of said level discrimination means, and switch means turned on in response to the application of the output of said change point detection means.

3. An analog-to-digital converter according to claim 2, wherein said high-order code conversion means uses the outputs of said change point detection means to determine a digital code representing high-order bits.

4. An analog-to-digital converter according to claim 2, wherein, when said switch means is turned on in response to the application of the output of said change point detection means, said low-order code conversion means uses the output of said adder means to determine a digital code representing low-order bits.

5. An analog-to-digital converter according to claim 1, wherein said adder means adds current outputs of said comparators belonging to the same group.

6. An analog-to-digital converter according to claim 1, wherein said adder means includes a current switch controlled by the output of each said comparator, and current output terminals of said current switches associated with said comparators whose outputs are to be added are interconnected for connection to a load resistor, and wherein said level discrimination means is a comparator comparing the terminal voltage of said load resistor with said predetermined threshold level.

7. An analog-to-digital converter according to claim 1, wherein said adder means includes a current switch controlled by the output of each said comparator, and positive output terminals and inverted output terminals of said current switches associated with said comparators whose outputs are to be added are interconnected for connection to load resistors respectively, a constant current source being connected to one of said positive and inverted output terminals, and wherein said level discrimination means is a comparator comparing the terminal voltages of said load resistors.

8. An analog-digital converter comprising:
means including a plurality of series-connected resistors for providing a plurality of reference signals corresponding to a desired resolution;

a plurality of parallel-connected comparators for comparing an analog input signal with said reference signals;

adder means for adding outputs of said comparators belonging to each of groups obtained by dividing said plural comparators into groups each consisting of $2^M$ comparators (M=2,3).

level discrimination means for deciding whether the output level of each of said adder means is $2^M$ times or less than $2^M$ times as high as the output level of a single comparator;

change point detection means for detecting a change point between the outputs of adjacent ones of said level discrimination means;

switch means turned on in response to the application of the output of said change point detection means;

high-order code conversion means using the output of said change point detection means to determine a digital code representing high-order bits; and low-order code conversion means using, when said switch means is turned on in response to the application of the output of said change point detection means, the output of said adder means associated with said switch means to determine a digital code representing low-order bits.

9. An analog-digital converter according to claim 8, wherein said change point detection means includes an exclusive-OR circuit taking the exclusive-OR logic of the outputs of said adjacent level discrimination means so that the output of said exclusive-OR circuit is used to determine high-order bits, and wherein the result of addition of the outputs of the comparators belonging to the group in which the result of addition is the level less than $2^M$ times as high as the output level of a single comparator, and which is next to the group in which the result of addition is the level $2^M$ times, is selected by said switch means to be used to determine low-order bits.

10. An analog-to-digital converter according to claim 8, wherein said adder means adds current outputs of said comparators belonging to the same group.

11. An analog-digital converter according to claim 8, wherein said adder means includes a current switch controlled by the output of each said comparator, and current output terminals of said current switches associated with said comparators whose outputs are to be added are interconnected for connection to a load resistor, and wherein said level discrimination means is a comparator comparing the terminal voltage of said load resistor with said predetermined threshold level.

12. An analog-to-digital converter according to claim 8, wherein said adder means includes a current switch controlled by the output of each said comparator, and positive output terminals and inverted output terminals of said current switches associated with said comparators whose outputs are to be added are interconnected for connection to load resistors respectively, a constant current source being connected to one of said positive and inverted output terminals, and wherein said level discrimination means is a comparator comparing the terminal voltages of said load resistors.

13. An analog-to-digital converter comprising:
means including a plurality of series-connected resistors for providing a plurality of reference signals corresponding to a desired resolution;

a plurality of parallel-connected comparators for comparing an analog input signal with said reference signals;

adder means for adding outputs of said comparators belonging to each of groups obtained by dividing said plural comparators into groups each consisting of $2^M$ comparators (M=2,3) and also adding outputs of some of said comparators belonging to the next adjacent high-order group;

level discrimination means for deciding whether the output level of each of said adder means is $2^M$ times or less than $2^M$ times as high as the output level of a single comparator;

change point detection means for detecting a change point between the outputs of adjacent ones of said level discrimination means;

switch means turned on in response to the application of the output of said change point detection means;

high-order code conversion means using the output of said change point detection means to determine a digital code representing high-order bits; and low-order code conversion means using, when said switch means is turned on in response to the application of the output of said change point detection means, the output of said adder means associated with said switch means to determine a digital code representing low-order bits.

14. An analog-to-digital converter according to claim 13, wherein said change point detection means includes an exclusive-OR circuit taking the exclusive-OR logic of the outputs of said adjacent level discrimination means so that the output of said exclusive-OR circuit is used to determine high-order bits, and wherein the result of addition of the outputs of the comparators belonging to the group in which the result of addition is the level less than $2^M$ times as high as the output level of a single comparator, and which is next to the group in which the result of addition is the level $2^M$ times, is selected by said switch means to be used to determine low-order bits.

15. An analog-to-digital converter according to claim 13, wherein some of said comparators whose outputs are also added by said adder means are located adjacent and continuous to said comparators in the low-order group.

16. An analog-to-digital converter according to claim 13, wherein said adder means adds current outputs of said comparators belonging to the different groups.

17. An analog-to-digital converter according to claim 13, wherein said adder means adds current outputs of said comparators belonging to the different groups.

18. An analog-to-digital converter according to claim 13, wherein said adder means includes a current switch controlled by the output of each said comparator, and current output terminals of said current switches associated with said comparators whose outputs are to be added are interconnected for connection to a load resistor, and wherein said level discrimination means is a comparator comparing the terminal voltage of said load resistor with said predetermined threshold level.

19. An analog-digital converter according to claim 13, wherein said adder means includes a current switch controlled by the output of each said comparator, and positive output terminals and inverted output terminals of said current switches associated with said comparators whose outputs are to be added are interconnected for connection to load resistors respectively, a constant current source being connected to one of said positive and inverted output terminals, and wherein said level discrimination means is a comparator comparing the terminal voltages of said load resistors.

* * * * *